(12) United States Patent
Lindelauf et al.

(10) Patent No.: US 7,678,196 B2
(45) Date of Patent: Mar. 16, 2010

(54) SYSTEM AND METHOD FOR TREATING SUBSTRATES

(75) Inventors: Paul August M. Lindelauf, Veldhoven (NL); Marinus Franciscus J. Evers, Heeze (NL)

(73) Assignee: OTB Solar B.V., Eindhoven (NL)

( * ) Notice: Subject to any disclaimer, the term of this patent is extended or adjusted under 35 U.S.C. 154(b) by 939 days.

(21) Appl. No.: 10/570,260

(22) PCT Filed: Aug. 26, 2004

(86) PCT No.: PCT/NL2004/000598

§ 371 (c)(1),
(2), (4) Date: Jun. 20, 2006

(87) PCT Pub. No.: WO2005/026405

PCT Pub. Date: Mar. 24, 2005

(65) Prior Publication Data

US 2006/0280871 A1    Dec. 14, 2006

(30) Foreign Application Priority Data

Sep. 3, 2003    (NL) .................................. 1024215

(51) Int. Cl.
*C23C 16/00* (2006.01)
(52) U.S. Cl. .................... 118/715; 118/719; 427/248.1
(58) Field of Classification Search ............... 427/248.1
See application file for complete search history.

(56) References Cited

U.S. PATENT DOCUMENTS

| 2001/0001951 | A1  | 5/2001  | Schertler |
| 2002/0024647 | A1* | 2/2002  | Nakahara et al. ............. 355/53 |
| 2002/0150691 | A1* | 10/2002 | Kitano et al. ............... 427/421 |

FOREIGN PATENT DOCUMENTS

| JP | 56-123367 | 9/1981 |
| JP | 6-5247    | 1/1994 |
| JP | 10-106051 | 4/1998 |

\* cited by examiner

*Primary Examiner*—Shamim Ahmed
(74) *Attorney, Agent, or Firm*—Pillsbury Winthrop Shaw Pittman LLP

(57) ABSTRACT

A system for treating substrates, provided with at least one processing chamber to treat at least one substrate with a vacuum process, wherein said processing chamber is provided with a substrate access closable by a closing body, wherein the system is provided with a conveying device which is at least arranged to move said closing body, wherein said conveying device is arranged to convey a mask, intended to at least partly cover said substrate during said vacuum process, at least between a position outside the processing chamber and a position inside the processing chamber. It is advantageous when at least said substrate holder is provided with positioning means to position the substrate holder and the mask relative to each other. The invention further provides a use of such a system.

41 Claims, 6 Drawing Sheets

SYSTEM AND METHOD FOR TREATING SUBSTRATES

This application is the National Phase of PCT/NL2004/000598, filed Aug. 26, 2004, which claims priority to Netherlands application 1024215, filed Sep. 3, 2003, the entire contents of both applications being incorporated herein by reference in their entireties.

The invention relates to a system for treating substrates, where the system is provided with at least one processing chamber to treat at least one substrate with a vacuum process, while this processing chamber is provided with a substrate access closable by a closing body, while the system is provided with a conveying device which is at least arranged to move this closing body.

Such a system is known from practice. The vacuum process may comprise various types of processes, for instance a deposition process, etching process, evaporation process, molecular bundle epitaxy, PVD, CVD, PE-CVD, printing, curing and the like. In such a known system, a substrate is brought into the processing chamber via the substrate access. The substrate access can then be hermetically closed so that certain process substances are prevented from leaving the processing chamber during the substrate treatment and/or in order to maintain the processing chamber at a desired pressure. After this, the treatment is started. The closing off of the substrate access during the substrate treatment may, for instance, be brought about by a substrate holder, which is known from the non-prior published European patent application no. EP 03076554.9 in the name of applicant, which application is understood to be inserted herein by reference.

In addition, the hermetical closing off of the processing chamber is desired when no substrate has been brought into the processing chamber, for instance during maintenance of the processing chamber and/or to prevent pollution of a vacuum substrate conveying space coupled to the substrate access outside the processing chamber. In that case, the substrate access can also be closed by the closing body movable by the conveying device.

In certain cases, it is further desired to cover a part of the substrate, in particular to locally treat the substrate, for instance for the purpose of locally applying material layers. This is usually achieved by disposing a mask in the processing chamber, in a substrate covering position in front of the substrate. Such a mask is preferably replaceable, for instance to clean the mask if it is polluted, and/or when use of a differently designed mask is desired. The accurate positioning of the mask relative to the substrate is often difficult.

The present invention contemplates an improvement of the system described in the opening paragraph. In particular, the invention contemplates a system by means of which the mask can be replaced relatively simply and fast.

For this purpose, the system of the type described in the opening paragraph is characterized in that a conveying device is arranged to convey a mask, intended to at least partly cover the substrate during the vacuum process, at least between a position outside the processing chamber and a position inside the processing chamber.

This conveying device is arranged to convey a mask, intended to at least partly cover the substrate during the vacuum process, at least between a position outside the processing chamber and a position inside the processing chamber. In this manner, the conveying device has at least two functions, namely conveying the closing body, and mask conveyance. The term conveying device does not only include the exemplary embodiment shown but, for instance, also a conveying device provided with two manipulators drivable independently of each other, of which a first conveys the closing body and the other the mask. The mask can simply be brought into and taken out of the processing chamber by this conveying device. Moreover, in this manner, the system can have a relatively simple and compact design.

The system is preferably provided with a mask vacuum lock disposed outside the processing chamber to replace the mask, while the conveying device is arranged to convey the mask from the processing chamber to the vacuum lock and vice versa. By use of the vacuum lock, the pressure in the processing chamber can be maintained at a desired, relatively low level during the mask replacement, so that pollution of the processing chamber can adequately be prevented during mask replacement.

According to a further elaboration of the invention, it is particularly advantageous when the conveying device is arranged to substantially simultaneously hold the mask and the closing body. In this manner, the replacement of the mask can be carried out relatively fast, since the mask and the closing body can thus substantially simultaneously be moved. The mask can, for instance, be moved out of the processing chamber by the conveying device, while the closing body is moved into the processing chamber, and vice versa. Here, the movement of the mask is substantially not or relatively little hindered by movement of the closing body. It is further advantageous when the conveying device is arranged to move the mask and the closing body in a common conveying direction, so that relatively little space needs to be available for the purpose of the mask conveyance and the movement of the closing body.

The conveying device may be designed in various manners for the purpose of the movement of the mask and the closing body. According to the invention, it is advantageous when the conveying device is provided with a movable conveying frame arranged to hold the mask and the closing body. In that case, the processing chamber may, for instance, be provided with at least one frame passage to move at least a part of the conveying frame therethrough.

In addition, the invention provides a conveying device for the purpose of a system according to the invention. This conveying device may, for instance, be provided in a substrate treatment system to offer abovementioned advantages thereto.

The invention further provides a method for treating substrates utilizing a system according to the invention, where the at least one substrate is disposed in the processing chamber, while a part of a surface to be treated of the substrate is covered by the mask, while, then, a vacuum process is carried out in the processing chamber to treat at least the part of the substrate surface not covered by the mask. The method uses the system provided by the invention in an advantageous manner. According to the method, the at least one substrate is arranged in the processing chamber. A part of the surface to be treated of the substrate is covered by the mask. Then, a vacuum process is carried out in the processing chamber to treat at least the part of the substrate surface not covered by the mask. The mask can relatively fast and simply be replaced by means of the conveying device.

The system further contemplates a system by means of which the substrate can relatively simply, accurately and fast be positioned relative to the mask.

For this purpose, a treatment system according to the invention is characterized in that it is provided with at least one processing chamber and at least one movable substrate holder arranged to keep at least one substrate in the processing chamber, while the system is provided with mask holding means arranged to keep a mask in a substrate covering position in the processing chamber for covering at least a part of the substrate, while at least the substrate holder is provided with positioning means to position the substrate holder and the mask relative to each other. Because at least the substrate holder is provided with positioning means to position the substrate holder and the mask relative to each other, the substrate and the mask can relatively simply and accurately be positioned relative to each other.

The invention further provides a use of such a system, where the substrate is positioned in a desired position on the substrate holder, while the substrate holder and the mask are then positioned relative to each other utilizing the positioning means. The substrate is first positioned relative to the substrate holder. Then, the substrate holder, with the substrate, can be brought to the processing chamber and be positioned on the mask holding means. Here, the substrate is relatively simply, preferably automatically, positioned relative to the mask by the positioning means.

Further elaborations of the invention are described in the subclaims. The invention will now be explained on the basis of an exemplary embodiment and with reference to the drawing, in which:

Figure 1:
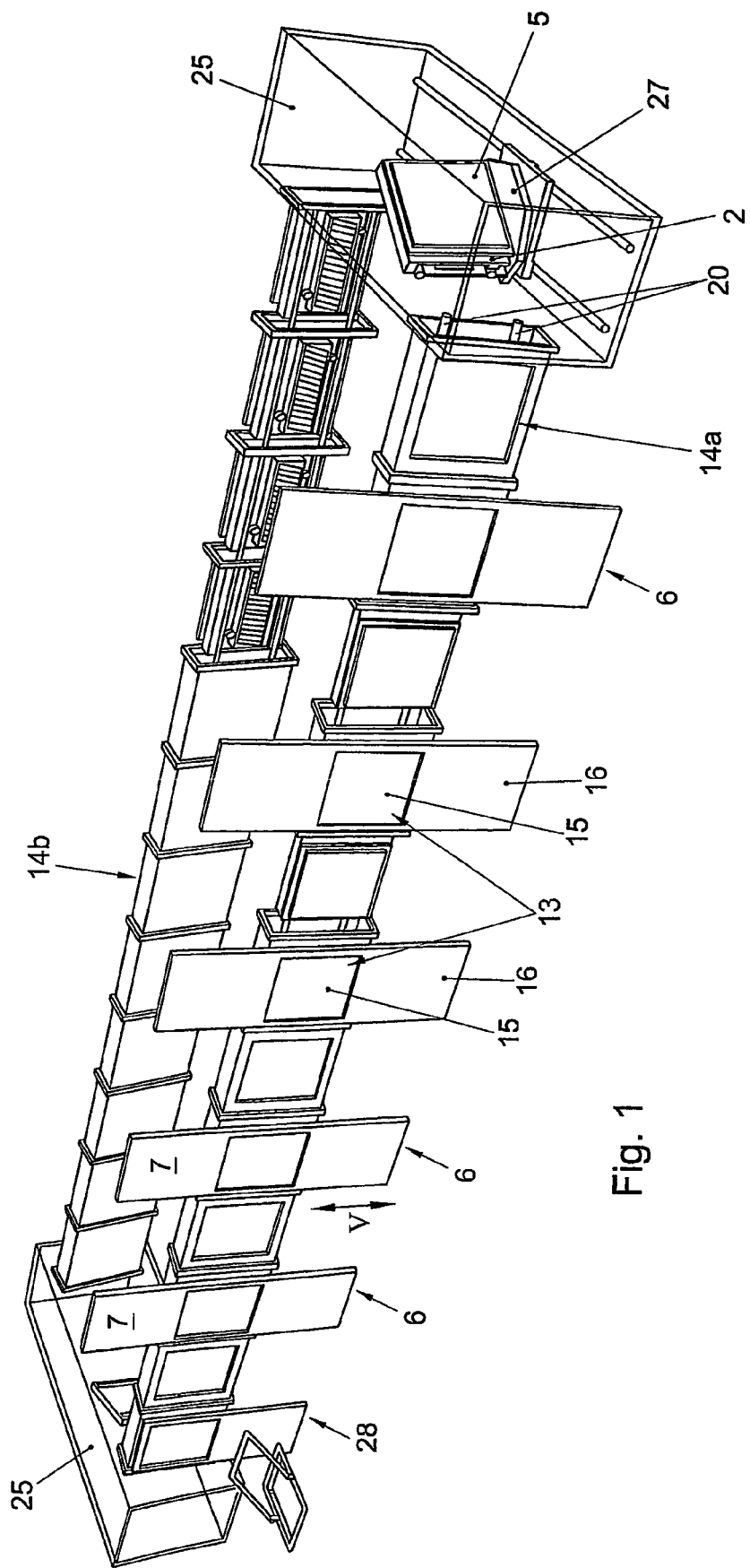
FIG. 1 shows a partly cutaway perspective view of an exemplary embodiment of the invention, where the conveying frames are in an upper position.
Figure 2:
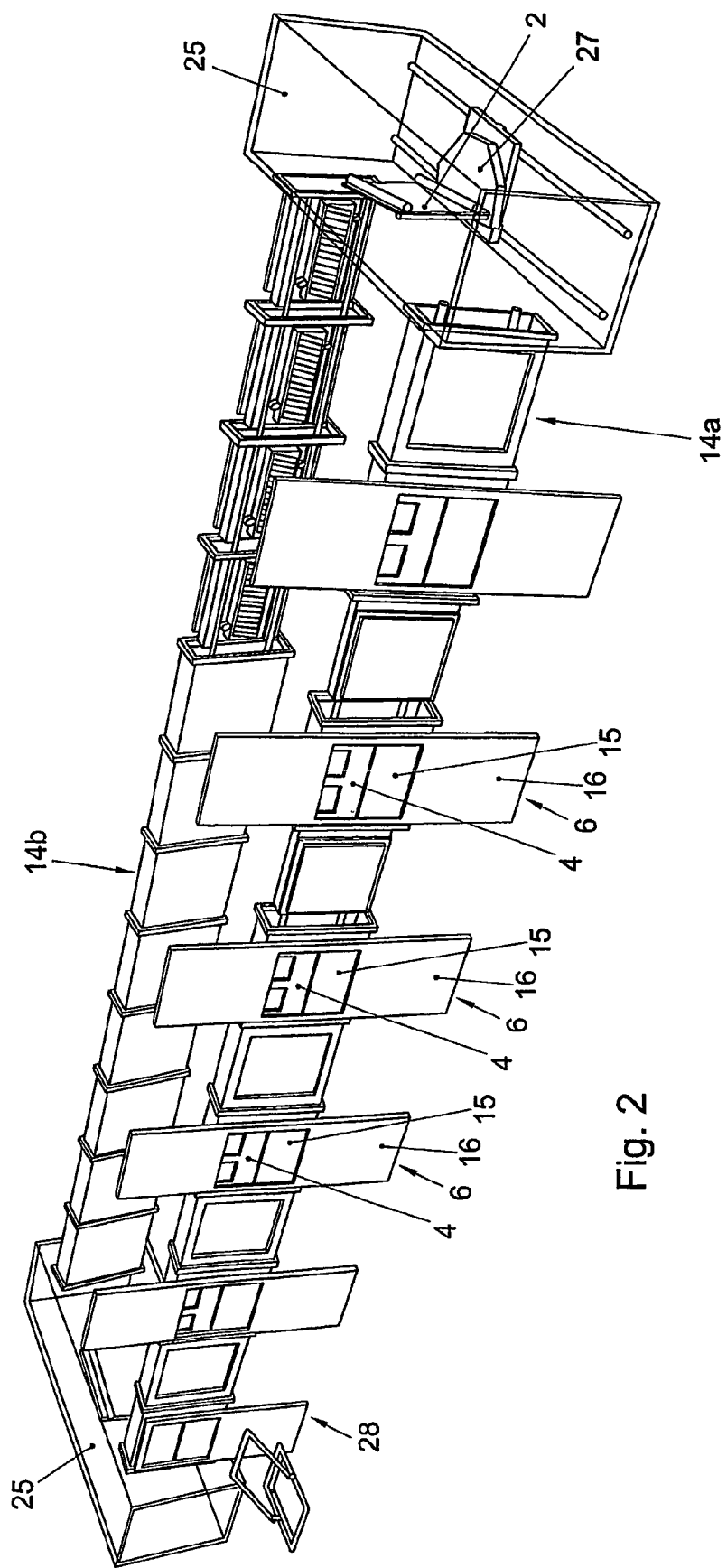
FIG. 2 shows a similar view to FIG. 1, where the conveying frames are in an intermediate position.
Figure 3:
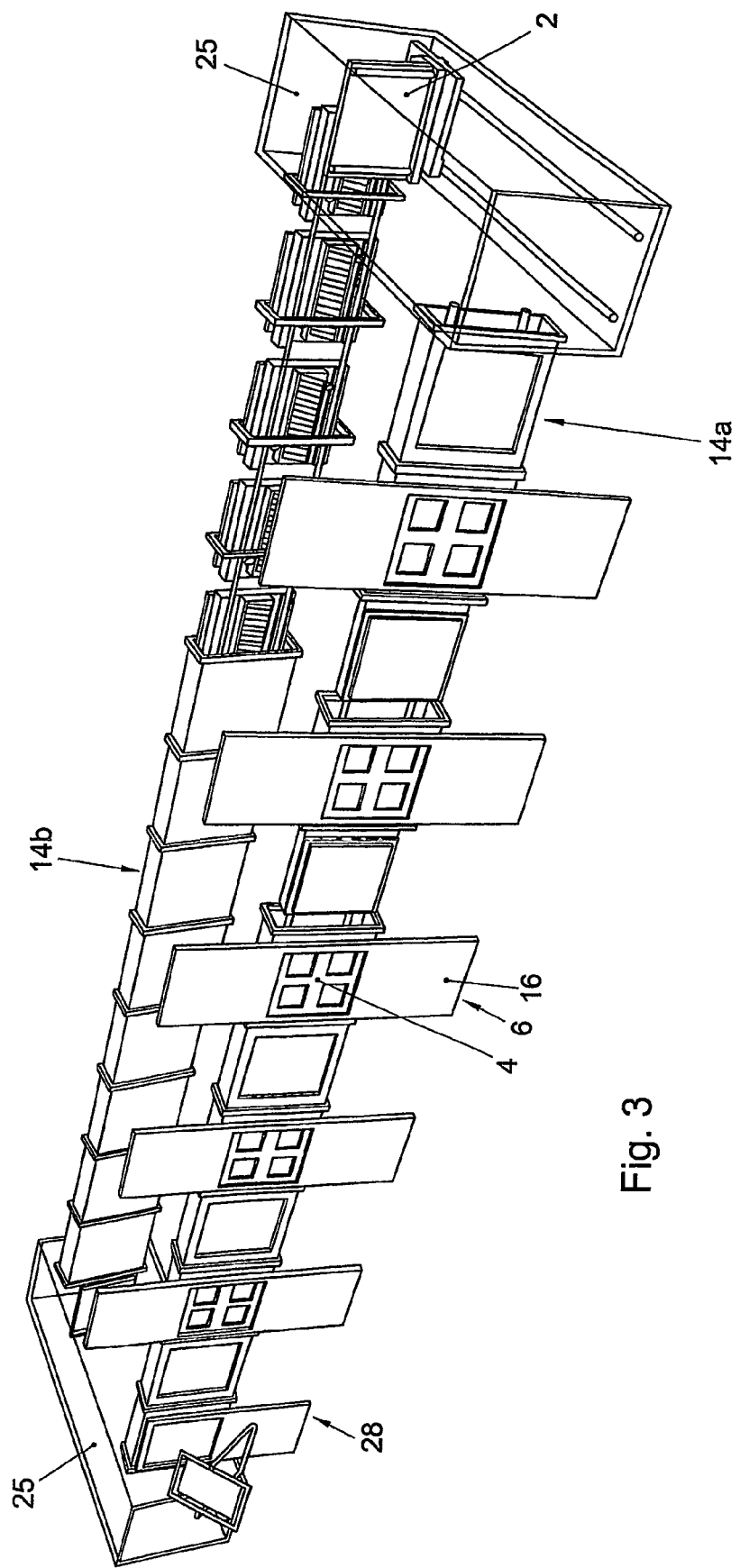
FIG. 3 shows a similar view to FIG. 1, where the conveying frames are in a lower position.

FIGS. 1-3 show a vacuum system for treating substrates. The system is particularly arranged to treat relatively flat and/or thin substrates, for instance disk-shaped substrates, semiconductor substrates, optical data carrier substrates, displays, three-dimensional substrates and/or the like. The system comprises substrate conveying means 19, 20, 21, which are preferably substantially designed in accordance with the known substrate conveying system from the European patent application no. EP 03076554.9. An advantage of such a substrate conveying system is that it can be used to subject a relatively large number of substrates to one or more desired vacuum treatments in a relatively short time.

In the present exemplary embodiment, the conveying system comprises two parallel-arranged elongated conveying chambers 14a, 14b surrounding vacuum conveying spaces 12. The conveying spaces 12 of the two conveying paths 14a, 14b are coupled to each other by their ends by means of substrate transfer stations 25. Substrates 5 are, in a substantially vertical position, by means of vertically disposed substrate holders 2, movable through the conveying spaces 12 and transfer stations 25. This vertical substrate position is advantageous to prevent pollution of the substrates 5.

A front side of the conveying paths 14a shown in FIGS. 1-3 is provided with five openings 13 which each form an access to a respective processing chamber 1. For the sake of clarity, these processing chambers 1 are not shown in FIGS. 1-3. The placement of a processing chamber 1 relative to the conveying path 14a is diagrammatically shown in FIGS. 4 and 5. The processing chambers 1 each serve to subject the substrates 5 to a particular treatment. The substrate holders 2 are arranged to keep the substrates 5 in a substantially vertical position in the processing chamber 1, and to simultaneously close off the substrate access 13, which is shown in FIG. 5. For the purpose of this closing off, each substrate holder 2 is provided with a closing section 48 shown in FIGS. 6 and 7. The front conveying path 14a is provided with a vacuum lock 28 to bring substrates 5 from an atmospheric environment into the vacuum system and to take them therefrom.

Figure 6:
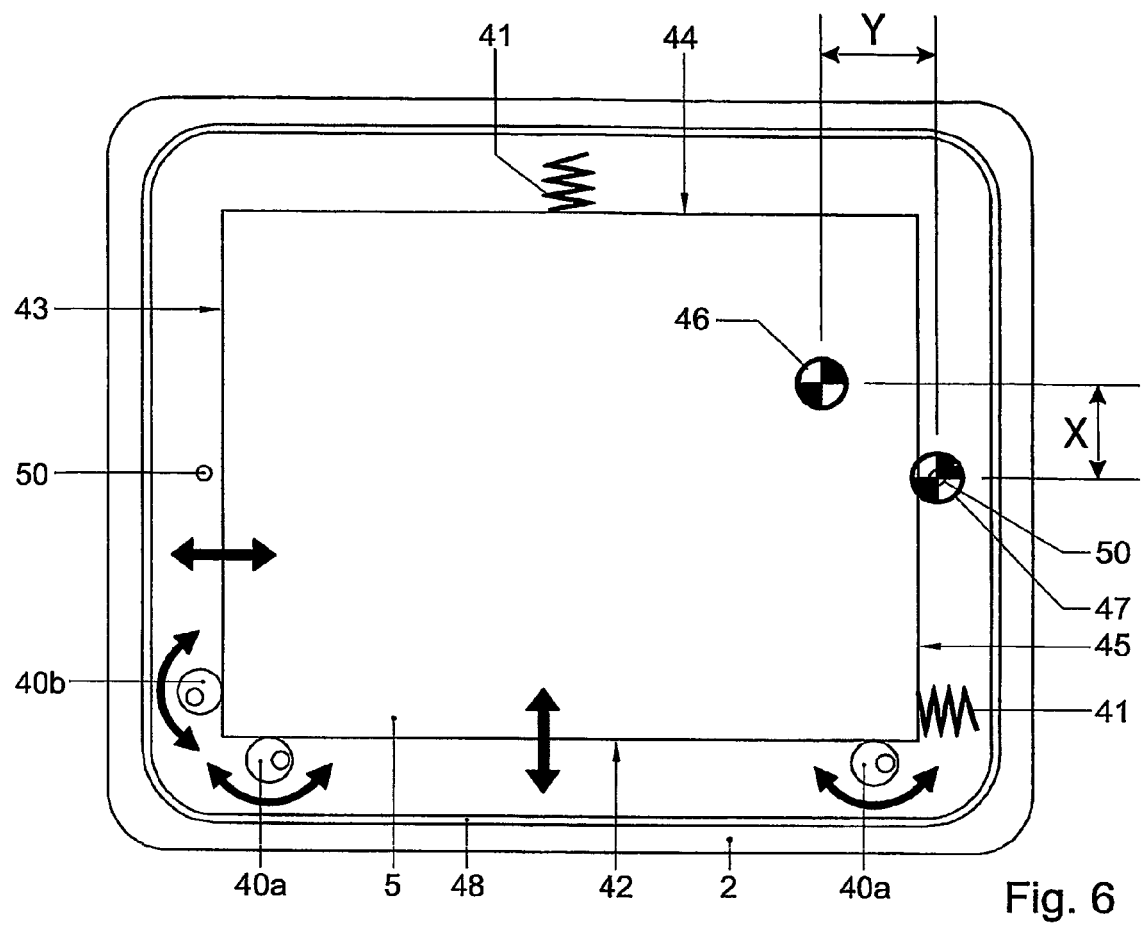
FIG. 6 shows a cross-sectional view over line VI-VI of the side elevational view shown in FIG. 5, where the mask is not shown.

As FIG. 6 shows, the substrate holder 2 is provided with substrate positioning means 40, 41 to position the substrate 5 present thereon. In the present exemplary embodiment, the substrate positioning means comprise two eccentrically rotatable supporting rollers 40a on which the substrate 5 is disposable by an underside 42. A third eccentrically rotatable roller 40b is provided to support the substrate on a longitudinal side 43. In addition, the substrate positioning means comprise springs 41 arranged to clamp the substrate 5 against the supporting rollers 40 by spring force, via opposite substrate sides 44, 45. Of course the substrate holder 2 may be provided with various different means to carry out the substrate positioning.

By rotation of the supporting rollers 40a, 40b, the substrate 5 can relatively accurately be positioned relative to the substrate holder 2, for instance such that a marker 46 of the substrate 5 is brought at desired distances in X and Y direction relative to a marker 47 of the substrate holder 2. For the purpose of positioning, the substrate 5 and substrate holder 2 may be provided with various types of aligning means, for instance optical aligning means, markers, light sources, light detectors, mechanical aligning means and/or the like.

Figure 4:
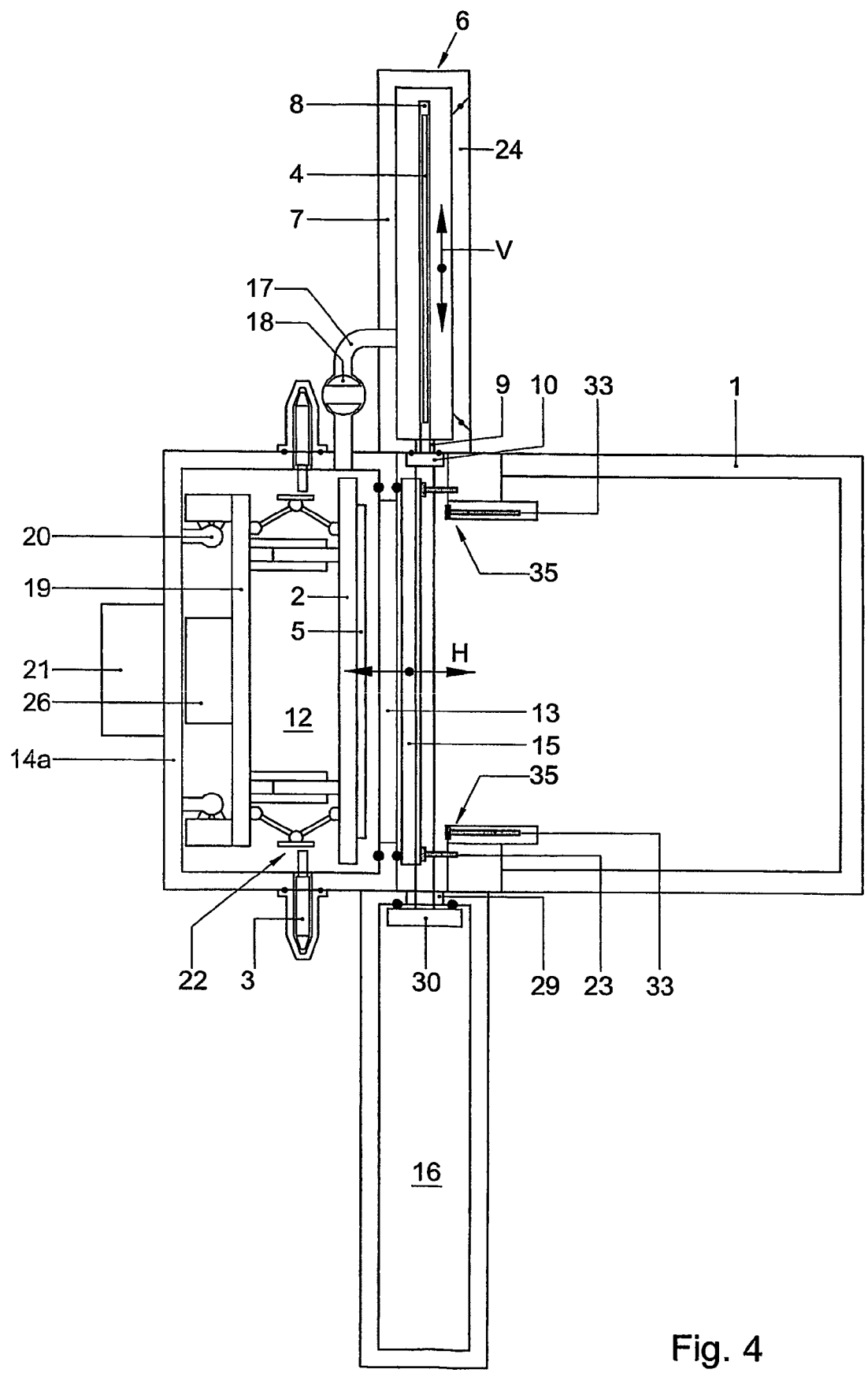
FIG. 4 shows a cutaway side elevational view of a part of the exemplary embodiment shown in FIG. 1, where the conveying frame is in the upper position.
Figure 5:
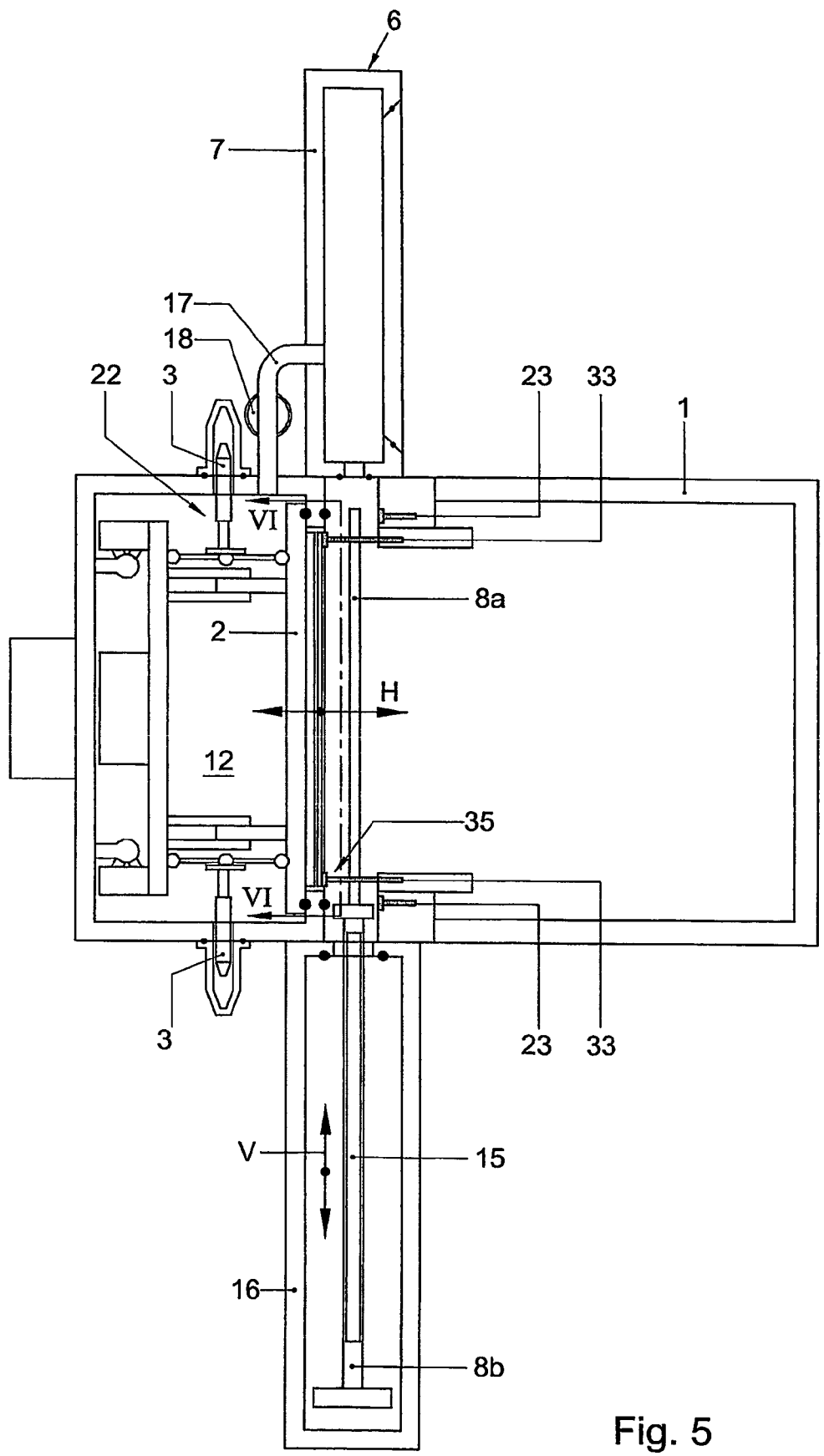
FIG. 5 shows a similar side elevational view to FIG. 4, where the conveying frame is in the lower position.

As FIGS. 4 and 5 show, the substrate conveying path 14a is provided with rails 20 to guide undercarriages 19 of the substrate holders 2 through the vacuum space 12. The system comprises magnetic means 26 to move each substrate holder 2 along the rails 20, in particular coils 21 disposed outside the conveying path 14 and magnets 26 provided on the undercarriages 19. Each substrate holder 2 is coupled to the respective undercarriage 19 so as to be movable in horizontal direction H, in particular by means of toggle lever systems 22. Of course, this may be designed in many different manners. With the processing chamber 1, these lever systems 22 are operable by first actuators 3 to press the substrate holder 2 against the substrate access 13 of the processing chamber 1 and close off this access 13 from the outside. The actuators 3 may, for instance, be fixed both to the chamber 14a and to the undercarriage 19.

Each processing chamber 1 is further provided with a closing body 15 to hermetically close off the substrate access 13 from the inside, at least in a closing position shown in FIG. 4, and to open the substrate access 13 in an opening position. In addition, the substrate holder 2 and the closing body 15 are arranged to simultaneously close off the substrate access 13 on both sides, while a substrate 5 is kept in the substrate access 13 by the substrate holder 2.

The opening position of the closing body is shown in FIG. 5. In the opening position, the closing body 15 is movable between an upper position (not shown) extending opposite the substrate access 13 and a lower position shown in FIG. 5. In the lower position, the closing body 15 does not extend opposite the substrate access 13, but is located in a receiving chamber 16 disposed below the processing chamber 1. The processing chamber 1 is provided with second linear actuators 23 to move the closing body 15 in horizontal direction H between the closing position and the upper position of the opening position.

The system is provided with a number of conveying devices to bring about the vertical movement of the closing bodies 15. Each conveying device comprises a conveying frame 8 extending in vertical direction, which is movable in longitudinal frame direction V between an upper and a lower frame position. The upper frame position is shown in FIG. 4, while FIG. 5 shows the lower frame position. A lower frame segment 8b of the frame 8 is arranged to be received the closing body in the opening position. When the conveying frame 8 is in the upper position, the lower frame segment 8b extends opposite the substrate access 13. In the lower frame position, the second segment 8b extends into the receiving chamber 16. The lower frame segment 8b is, together with the closing body 15, movable through a lower frame passage 29 of the wall of the respective processing chamber 1. A lower end of the conveying frame 8 is provided with a closing element 30 to close off the lower frame passage 29 when the conveying frame 8 has been moved to the upper frame position. Movement of the conveying frame 8 is brought about by a drive (not shown). This drive may be designed in various manners, which will be clear to a skilled person.

The processing chamber 1 of the system is further provided with mask holding means 35 arranged to keep a mask 4 in a substantially vertical substrate covering position shown in FIG. 5 in the respective processing chamber 1 for covering at least a part of the substrate 5 kept in the processing chamber 1 by the substrate holder 2. In addition, the mask holding means 35 are arranged to engage the mask 4 and to move the mask 4 in the horizontal direction H. For the purpose of movement, the mask holding means 35 are provided with third actuators 33. The system may further, for instance, be provided with means to position the mask 4 in a different, for instance vertical, direction relative to the substrate covering position. Because each mask 4 is kept in substantially vertical position in the system, accumulation of pollution on the mask 4 can adequately be prevented. Hence the mask 4 can be used in relatively many substrate treatments before the mask needs to undergo a cleaning treatment, which increases the productivity of the system. Further, in this manner, the risk that the substrate 5 is polluted via the mask 4 is reduced.

According to the invention, it is advantageous when the substrate holder 2 is provided with positioning means 50 to position the substrate holder 2 and the mask 4 relative to each other. In the present exemplary embodiment, these positioning means are arranged to position the mask 4 relative to the substrate holder 2. Hence, for the sake of clarity, these positioning means are referred to as mask positioning means hereinbelow. Preferably, the mask 4 and/or the mask holding means 35 are provided with mask positioning means 51 arranged to cooperate with the mask positioning means 50 of the substrate holder 2 for the purpose of positioning the mask 4. In this manner, the mask can simply be positioned relative to the substrate holder 2 and a substrate 5 positioned thereon. It is further advantageous when the mask positioning means 50, 51 are arranged to couple the substrate holder 2 to the mask holding means 35 and/or the mask 4 in a position desired for positioning when the substrate holder 2 and the mask 4 are brought in a position moved towards each other.

Figure 7:
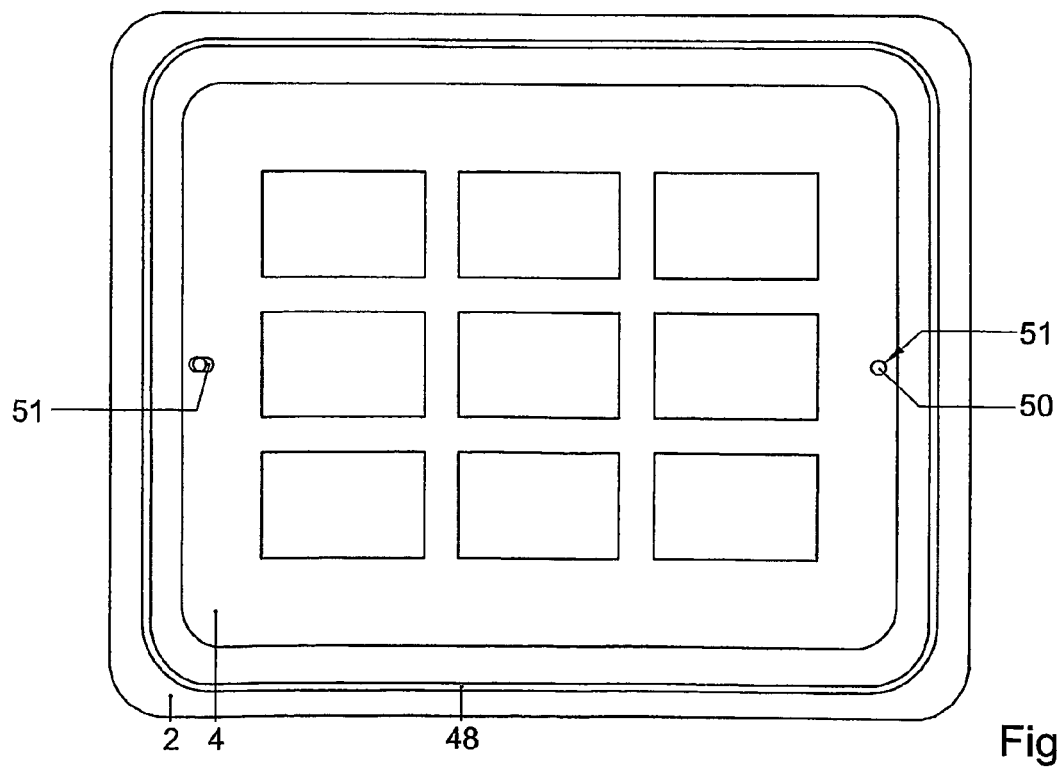
FIG. 7 shows a similar view to FIG. 6, where the mask is shown.

As FIGS. 6 and 7 show, in the present exemplary embodiment, each mask 4 is provided with the mask positioning means 51, which are arranged to cooperate with the mask positioning means 50 of the substrate holder 2. The mask positioning means 50, 51 may be designed in different manners, for instance mechanical, electromagnetic, optical and the like. The present exemplary embodiment is provided with relatively simple mechanical mask positioning means 50, 51, which particularly comprise tenons 50 provided so as to be perpendicular to the substrate holder 2, which are bringable into respective mortises 51 upon moving the mask 4 towards the substrate holder 2.

Each processing chamber 1 of the exemplary embodiment is provided with a mask replacing unit 6 to replace the mask 4. As FIGS. 1-5 show, each mask replacing unit 6 comprises a mask vacuum lock 7 with an access hatch 25 which is arranged above the respective processing chamber 1. This mask vacuum lock 7 and the closing body receiving chamber 16 are arranged substantially opposite to each other relative to the processing chamber 1.

The system comprises mask conveying means 8 to convey the mask 4 from the processing chamber 1 to the mask vacuum lock 7 and vice versa. In the present exemplary embodiment, these mask conveying means comprise an upper frame segment 8a of the conveying frame 8 in an advantageous manner. The upper frame segment 8a extends in line with the lower frame segment 8b. In the upper position of the conveying frame 8, the upper frame segment 8a extends into the mask vacuum lock 7, which is shown in FIG. 4. In the lower frame position, the upper frame segment 8a extends, conversely, opposite the substrate access 13, see FIG. 5.

As FIGS. 4 and 5 show, the conveying frame 8 is arranged to keep the mask 4 in substantially vertical position during mask conveyance. In addition, the conveying frame 8 is arranged to move the mask 4 in substantially vertical direction into and out of the processing chamber 1, via an upper frame passage 9 extending through the wall of the processing chamber 1. This upper frame passage 9 extends opposite the lower frame passage 29 in the wall of the processing chamber 1. This upper frame passage 9 preferably has a relatively narrow design. Because the frame with the mask is movable in longitudinal frame direction, the inner space of the mask lock 7 can, in addition, take up relatively little volume. Hence pollution of the mask lock 7 and processing chamber 1 can adequately be prevented, while the mask lock can relatively fast be brought to a desired vacuum pressure Between the upper frame segment 8a and lower frame segment 8b, the conveying frame 8 is provided with a closing element 10 to close off the upper frame passage 9 when the frame 8 has been brought to the position moved upwards.

Between the substrate conveying space 12 and the mask vacuum lock 7, a fluid connection 17 closable by a closing device 18 is provided. During use, a vacuum can be created in the vacuum lock 7 via this fluid connection 17 and the vacuum conveying space 12. In addition, the mask lock 7 may, for instance via such a fluid connection provided with a closing device, be connected to the processing chamber 1 to pump down the lock via the processing chamber 1. In addition, the mask lock 7 may, for instance, be provided with separate vacuum pumps to create a desired vacuum in the lock.

Preferably, the system, for instance the mask lock 7, is provided with mask inspecting means to inspect the quality of the mask 4 and/or to observe pollution present on the mask 4. The mask lock 7 may, for instance, comprise cleaning means to clean a mask 4 present in the lock 7, for instance blow-cleaning means.

With the mask replacing unit 6 and the conveying frame 8, the mask 4 can relatively fast be automatically replaced, for instance to be cleaned and/or to carry out a process with a differently arranged mask in the processing chamber 1. Because the mask replacing unit 6 comprises a mask vacuum lock 7, the mask replacement can be carried out without the processing chamber needing to be brought to atmospheric pressure. Hence, pollution of the processing chamber 1 during the replacement of the mask can adequately be prevented.

The system is preferably provided with or connected to a control to have the mask replacement take place automatically.

During use of the system, substrates 5 can be brought into and/or taken out of the conveying space 12 via the substrate lock 28. The substrates 5 are kept in a vertical position in the conveying space 12 and are brought to the processing chambers 1 by the substrate holders 2 in order to be subjected to a treatment there. During use, the substrates 5 are each once accurately positioned on the substrate holders 2 in positions desired for treatment by means of the substrate positioning means 40a, 40b. This substrate positioning may, for instance, take place in the substrate lock 28 or elsewhere in the system. In addition, during the treatment, a substrate 5 may be at least partly covered by the mask 4.

During use, in a simple manner, the mask 4 can be brought from an atmospheric environment to a position inside the processing chamber 1 and vice versa for the purpose of substrate treatment, which is further elucidated in the following. FIGS. 1 and 4 show a starting situation in which the substrate access 13 of each processing chamber 1 is hermetically closed off from the substrate conveying space 12 by a respective closing body 15. In this manner, the processing chambers 1 and the substrate conveying space 12 can be maintained at a desired, low pressure, while pollution of the substrate conveying space 12 can be prevented, for instance pollution by process gases coming from the processing chamber 1 and/or coatings to be applied. In the conveying space 12, opposite each substrate access 13, a substrate holder 2, with substrate 5, is disposed.

As FIG. 4 shows, in the starting situation, the conveying frame 8 is in the upper position, so that the upper frame passage 9 is closed off by the closing element 10 of the frame 8. Further, the fluid connection 17 between the mask lock 7 and the substrate conveying space 12 is closed off by the closing device 18 which is in the closing position. As a result, the mask lock 7 is closed off from the processing chamber 1 and the substrate conveying space 12, so that the mask lock 7 can brought to substantially atmospheric pressure and be opened to remove a mask 4 from the upper frame segment 8a and to replace it by another mask 4. Further, a mask present in the mask lock 7 can be subjected to, for instance, an inspection and/or cleaning treatment.

The conveying frame 8 can easily bring the mask 4 present thereon from the mask lock 7 to a position inside the processing chamber 1, while the frame 8 simultaneously takes the closing body 15 out of the processing chamber 1, which is shown in FIGS. 2, 3 and 5. For this purpose, the mask lock 7 is first brought to a desired, low pressure by means of the vacuum pumps and/or by opening the closing device 18 of the fluid connection 17. Bringing the mask lock to the desired pressure can be carried out relatively fast because the mask lock 7 has a relatively small internal volume. In addition, on a side facing away from the processing chamber 1, the substrate access 13 is closed off by pressing the substrate holder 2 against this access 13 by the closing section 48, which is carried out by the toggle lever systems 22 and the first actuators 3. Here, the substrate 5 held by the substrate holder 2 is brought into the substrate access 13 of the processing chamber 1. In this position (not shown) of the system, on the one side, the substrate access 13 is closed off by the substrate holder 2 and, on the other side, by the closing body 15. The substrate 5 held by the substrate holder 2 is then between the substrate holder 2 and the closing body 15, in the substrate access 13.

After the substrate access 13 has been closed off by the substrate holder 2, the closing body 15 is moved by the second actuators 23 in a horizontal direction H away from the substrate access 13 and placed on the lower frame segment 8b.

When both the mask 4 and the closing body 15 are held by the conveying frame 8, the mask vacuum lock has been pumped down and the substrate access 13 has been closed off by the substrate holder 2, then the conveying frame 8 is moved downwards via an intermediate position shown in FIG. 2 to the lower position shown in FIGS. 3 and 5. As a result, both the mask 4 and the closing body 15 are moved in vertical direction V. The mask 4 is then in a position opposite the opened substrate access 13, inside the processing chamber 1.

After this, the mask 4 is removed from the conveying frame 8 by the mask holding means 35 and brought to the substrate covering position shown in FIG. 5 near or in the substrate access 13. Here, the mask 4 is, for instance, pressed against the substrate 5 or held at a relatively short distance from the substrate 5. When moving towards the substrate 5, the positioning tenons 50 of the substrate holder 2 and the respective positioning mortises 51 of the mask engage each other to bring about a simple, mechanical positioning of the substrate holder 2 relative to the mask 4. This positioning of the substrate 5 relative to the substrate holder 2, and the positioning of the substrate holder 2 and the mask 4 are preferably such that the substrate 5 has been positioned relative to the mask 4 in a position desired and suitable for treatment.

When the mask 4 has been brought into the substrate covering position in front of the substrate 5, a vacuum process can be carried out in the processing chamber 1 to treat at least the part not covered by the mask 4 of the part of the substrate surface facing the processing chamber 1. As FIG. 5 shows, the closing body 15 is kept in the respective receiving chamber 16 outside the processing chamber 1 by the conveying frame when the conveying frame 8 has been brought in the lower position. As a result, the substrate treatment is not hindered by the closing body 15. During the substrate treatment, the substrate holder 2 is preferably screened from the treatment process carried out in the processing chamber 1 substantially by the substrate 5 and the mask 4, for instance to prevent pollution of the substrate holder 2.

After the substrate treatment, the mask 4 is brought back to the mask lock 7 by means of the mask holding means 35 and the conveying frame 8, while the closing body 15 is placed on the substrate access 13 by means of the conveying frame 8 and the second actuators 23 in order to close this access 13. The mask 4 may then, for instance, again be inspected and/or replaced in the mask lock 7. Then, the substrate holder 2 may be moved away from the substrate access 13 and be replaced by a next substrate holder holding the next substrate to be treated. After this, the mask 4 may again be brought from the mask lock 7 to the mask covering position in the processing chamber 1 in order to partly cover this next substrate for the purpose of treatment.

It follows from the above that the substrate access 13 is closed off by a substrate holder 2 during mask conveyance, while the substrate access 13 is closed off by the closing body 15 during substrate replacement. In this manner, the substrate access 13 is substantially continuously closed off, which is, for instance, advantageous to absorb possible pressure differences between the processing chamber 1 and the substrate conveying space 12.

It goes without saying that the invention is not limited to the exemplary embodiment described. Various modifications are possible within the scope of the invention as set forth in the following claims.

For instance, the conveying frame 8 may be designed in various manners and in various forms.

Further, the system may be arranged to keep and/or move the substrates and/or masks in various positions, for instance horizontal, inclined, upside down and/or vertical.

The holding means for the mask 4 and/or the closing body may be designed in various manners and may, for instance, be provided with actuators, linear actuators, lever mechanisms, electric motors, magnetic and/or electromagnetic engaging means and the like.

Further, during use, different pressures may prevail in the system. For instance, the pressure in the processing chamber 1 during a substrate treatment may be higher than the pressure when the processing chamber 1 is not operative.

The term 'vacuum' is to be taken in a relatively broad sense. Thus, is 'vacuum' is also understood to mean any environment conditioned relative to the outside air with regard to pressure and composition of the gas.

In addition, the positioning means to position the substrate holder and the mask relative to each other may be designed in various manners. These positioning means may comprise, for instance, active and/or passive means, engaging means, guide means, positioning sensors and the like.

The invention claimed is:

1. A system for treating substrates, comprising:
   a processing chamber configured to treat a substrate with a vacuum process, wherein said processing chamber is provided with a substrate access closable by a closing body;
   a substrate conveyor configured to bring the substrate from the substrate access to the processing chamber and take it away therefrom; and
   a conveying device configured to move said closing body and configured to convey a mask, the mask configured to at least partly cover said substrate during said vacuum process, at least between a position outside the processing chamber and a position inside the processing chamber,
   wherein said conveying device is configured to simultaneously hold said mask and said closing body.

2. A system according to claim 1, further comprising:
   a mask vacuum lock disposed outside the processing chamber, wherein said conveying device is configured to convey said mask from the processing chamber to said vacuum lock and vice versa.

3. A system according to claim 1, further comprising:
   a closing body receiving chamber disposed outside the processing chamber, wherein said conveying device is configured to convey said closing body from the processing chamber to said receiving chamber and vice versa.

4. A system according to claim 2, wherein said mask vacuum lock and said closing body receiving chamber are disposed substantially opposite each other.

5. A system according to claim 1, wherein said conveying device is configured to move said mask and said closing body in a common conveying direction.

6. A system according to claim 5, wherein said common conveying direction comprises a vertical conveying direction.

7. A system according to claim 1, wherein said conveying device comprises a movable conveying frame configured to hold said mask and said closing body.

8. A system according to claim 7, wherein said conveying frame extends in substantially vertical direction.

9. A system according to claim 7, wherein said conveying frame is disposed so as to be movable substantially in a longitudinal frame direction.

10. A system according to claim 7, wherein said conveying frame comprises a first frame segment configured to hold said mask, and a second frame segment configured to hold said closing body.

11. A system according to claim 10, wherein the conveying frame is movable between a first and second position, wherein the first frame segment extends into the mask vacuum lock while the second segment extends opposite the substrate access in said first frame position, wherein the first frame segment extends opposite said substrate access and the second segment extends into said receiving chamber in said second frame position.

12. A system according to claim 7, wherein a wall of the processing chamber is provided with a frame passage to move at least a part of said conveying frame therethrough.

13. A system according to claim 10, wherein the processing chamber, on a first side, comprises a first frame passage to let said first frame segment pass, and, on a second side, comprises a second frame passage to let said second flame segment pass.

14. A system according claim 12, further comprising:
   a closure configured to close off said frame passage.

15. A system according to claim 7, wherein the conveying frame comprises a closing body holder configured to keep said closing body in such a closing position that said substrate access is closed off by the closing body.

16. A system according to claim 15, wherein said closing body holder is configured to move said closing body between said closing position and a position located on said conveying frame.

17. A system according to claim 7, wherein the conveying frame comprises a mask holder configured to keep said mask in a substrate covering position in the processing chamber for covering at least a part of said substrate to be treated.

18. A system according to claim 17, wherein said mask holder is configured to move said mask between said substrate covering position and a position on said conveying frame.

19. A system according to claim 17, wherein said mask holding holder is configured to keep said mask in a substantially vertical position.

20. A system according to claim 17, wherein said mask holder comprises actuators.

21. A system according to claim 1, further comprising:
   a mask inspector configured to inspect the quality of the mask and/or to observe pollution present on the mask.

22. A system according to claim 1, further comprising:
   a vacuum substrate conveying space coupled to said substrate access of said processing chamber, wherein the conveying space comprises said substrate conveyor to bring the substrate from the substrate access to the processing chamber and take it away therefrom.

23. A system according to claim 22, further comprising a closable fluid connection extending between said mask vacuum lock on the one side and said substrate conveying space and/or processing chamber on the other side.

24. A system according to claim 22, wherein said substrate conveyor is configured to convey said substrate in a substantially vertical position.

25. A system according to claim 22, wherein the substrate conveyor comprises movable substrate holders, wherein each substrate holder is configured to keep a substrate in said processing chamber and simultaneously close off said substrate access.

26. A system according to claim 25, wherein said substrate holders each comprise a positioning device configured to position the substrate holder and said mask relative to each other.

27. A system according to claim 25, wherein the substrate holder and the closing body are arranged to simultaneously close off the substrate access on both sides, while a substrate is kept in the substrate access by the substrate holder.

28. A system according to claim 1, wherein said closing body is configured to hermetically close off the substrate access from the inside.

29. A conveying device for a system for treating substrates, the system including a processing chamber configured to treat at lest one substrate with a vacuum process, wherein said processing chamber includes a substrate access closable by a closing body and a substrate conveyor configured to bring the substrate from the substrate access to the processing chamber and take it away therefrom, wherein said conveying device is configured to move said closing body and configured to convey a mask, the mask configured to at least partly cover said substrate during the vacuum process, at least between a position outside the processing chamber and a position inside the processing chamber, wherein said conveying device is configured to simultaneously hold said mask and said closing body.

30. A method for treating, comprising:

conveying a mask using a conveying device at least between a position outside a processing chamber and a position inside the processing chamber, wherein said processing chamber is provided with a substrate access closable by a closing body;

disposing a substrate in said processing chamber using a substrate conveyor;

covering a part of a surface to be treated of said substrate by said mask;

simultaneously holding said mask and said closing body using the conveying device; and carrying out a vacuum process in the processing chamber to treat the part of the said substrate surface not covered by the mask.

31. A method according to claim 30, further comprising:

replacing said mask by said conveying device prior to and/or after said substrate treatment.

32. A method according to claim 31, further comprising:

moving said mask out of the processing chamber into a mask vacuum lock while moving a closing body into the processing chamber to close off a substrate access;

opening the vacuum lock after the vacuum lock has been closed off from the processing chamber; and replacing said mask.

33. A method according to claim 32, wherein, during the replacement, said mask is moved out of and into said processing chamber in a substantially vertical direction.

34. A system for treating substrates, comprising:

a processing chamber having a substrate access closable by a closing body;

a movable substrate holder configured to keep a substrate in said processing chamber; and a mask holder configured to keep a mask in a substrate covering position in the processing chamber, wherein at least said substrate holder comprises a positioning device configured to position the substrate holder and the mask relative to each other, wherein said mask holder is configured to simultaneously hold said mask and said closing body.

35. A system according to claim 34, wherein said positioning device is configured to couple said substrate holder to said mask holder and/or said mask in a position desired for positioning when the substrate holder and the mask are brought into a position moved towards each other.

36. A system according to claim 34, wherein said mask comprises a mask positioning device configured to cooperate with said positioning device of said substrate holder for the purpose of said positioning.

37. A system according to claim 34, wherein said mask holder comprises a mask holder positioning device configured to cooperate with said positioning device of said substrate holder for the purpose of said positioning.

38. A system according to claim 36, wherein said positioning device and said mask positioning device comprise mechanical positioning devices.

39. A system according to claim 38, wherein said positioning device and said mask positioning device comprise mortise and tenon positioning devices.

40. A system according to claim 34, wherein said substrate holder comprises a substrate positioning device configured to position said substrate relative to the substrate holder.

41. A system according to claim according to claim 14, wherein the conveying frame comprises the closure.

* * * * *